(12) United States Patent
Liu et al.

(10) Patent No.: US 8,662,963 B2
(45) Date of Patent: Mar. 4, 2014

(54) CHEMICAL MECHANICAL POLISHING SYSTEM

(75) Inventors: Li-Chung Liu, Taichung (TW); Yi-Nan Chen, Taipei (TW); Hsien-Wen Liu, Taoyuan County (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 308 days.

(21) Appl. No.: 13/106,822

(22) Filed: May 12, 2011

(65) Prior Publication Data

US 2012/0289133 A1   Nov. 15, 2012

(51) Int. Cl.
*B24B 55/00*   (2006.01)

(52) U.S. Cl.
USPC ............ 451/60; 451/443; 451/446; 210/787

(58) Field of Classification Search
USPC .................. 451/36–444, 446, 447; 134/1.3, 134/104.2–104.4, 109–111; 205/650, 673; 210/787, 781
See application file for complete search history.

(56) References Cited

U.S. PATENT DOCUMENTS

| | | | | |
|---|---|---|---|---|
| 4,634,536 | A  * | 1/1987  | Grimwood et al. | 210/781 |
| 6,116,986 | A  * | 9/2000  | Togawa et al. | 451/36 |
| 6,328,640 | B1 * | 12/2001 | Jones et al. | 451/194 |
| 6,379,538 | B1 * | 4/2002  | Corlett et al. | 210/96.1 |
| 6,461,524 | B1 * | 10/2002 | Tsuihiji et al. | 210/777 |
| 6,593,282 | B1 * | 7/2003  | Li et al. | 510/175 |
| 6,802,983 | B2 * | 10/2004 | Mullee et al. | 210/749 |
| 2002/0121289 | A1 * | 9/2002 | Brown et al. | 134/6 |
| 2003/0054734 | A1 | 3/2003 | Mullee | |
| 2004/0155013 | A1 * | 8/2004 | Sotozaki et al. | 216/88 |

* cited by examiner

*Primary Examiner* — Lee D Wilson
*Assistant Examiner* — Tyrone V Hall, Jr.
(74) *Attorney, Agent, or Firm* — Winston Hsu; Scott Margo

(57) ABSTRACT

A chemical mechanical polishing (CMP) system includes a wafer polishing unit producing a used slurry; a slurry treatment system for receiving and treating the used slurry to thereby produce an extracted basic solution; and a post-CMP cleaning unit utilizing the extracted basic solution to wash a polished wafer surface. The post-CMP cleaning unit includes a plurality of rollers for supporting and rotating a wafer, a brush for scrubbing the wafer, and a spray bar disposed in proximity to the brush for spraying the extracted basic solution onto the polished wafer surface.

8 Claims, 3 Drawing Sheets

CHEMICAL MECHANICAL POLISHING SYSTEM

BACKGROUND OF THE INVENTION

1. Field of the Invention

The present invention relates generally to a wafer processing system. More particularly, the present invention relates to an integrated chemical mechanical polishing (CMP) system including a CMP wafer polishing unit and a post-CMP cleaning unit coupled to the CMP wafer polishing unit.

2. Description of the Prior Art

Chemical mechanical polishing (CMP) techniques are used for planarizing material layers on a wafer in semiconductor industry. In chemical mechanical polishing, slurry is dispensed onto a polishing surface of a polishing pad. Relative movement between the polishing surface and the wafer produces a combined mechanical and chemical effect on the surface of the wafer. This process creates a highly level surface on the wafer.

Polishing slurry or slurry is the main component used in the CMP process. Typically, the slurry used in the CMP process consists mainly of colloidal silica suspended in deionized water or KOH solution. The slurry is frequently fed by an automatic slurry feeding system in order to ensure uniform wetting of the polishing pad and proper delivery of the slurry. Conventionally, the once-used slurry is received by a waste liquid receiver in the CMP tool, stored in a waste liquid tank, and then completely disposed of.

After CMP, the wafer is transferred to a cleaning unit and scrubbed with roller-shaped PVA (polyvinyl acetate) brushes. During scrubbing of the wafer, a base chemical such as tetramethyl ammonium hydroxide (TMAH) is simultaneously applied onto the surface of the wafer to be cleaned. However, the amount of usage of TMAH is huge and accounts for about 1.3~1.5 USD per wafer. This makes it one of the major consumable cost factors in a CMP process. It would be advantageous to have an improved CMP system that is capable of reducing the cost of polishing each wafer.

SUMMARY OF THE INVENTION

It is one object of the present invention to provide an improved CMP system including a CMP wafer polishing unit and a post-CMP cleaning unit coupled to the CMP wafer polishing unit, which is capable of reducing the cost of polishing each wafer.

According to one aspect of the present invention, there is provided a chemical mechanical polishing (CMP) system comprising a wafer polishing unit producing a used slurry; a slurry treatment system for receiving and treating the used slurry to thereby produce an extracted basic solution; and a post-CMP cleaning unit utilizing the extracted basic solution to wash a polished wafer surface. The post-CMP cleaning unit comprises a plurality of rollers for supporting and rotating a wafer, a brush for scrubbing the wafer, and a spray bar disposed in proximity to the brush for spraying the extracted basic solution onto the polished wafer surface.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

Figure 1:
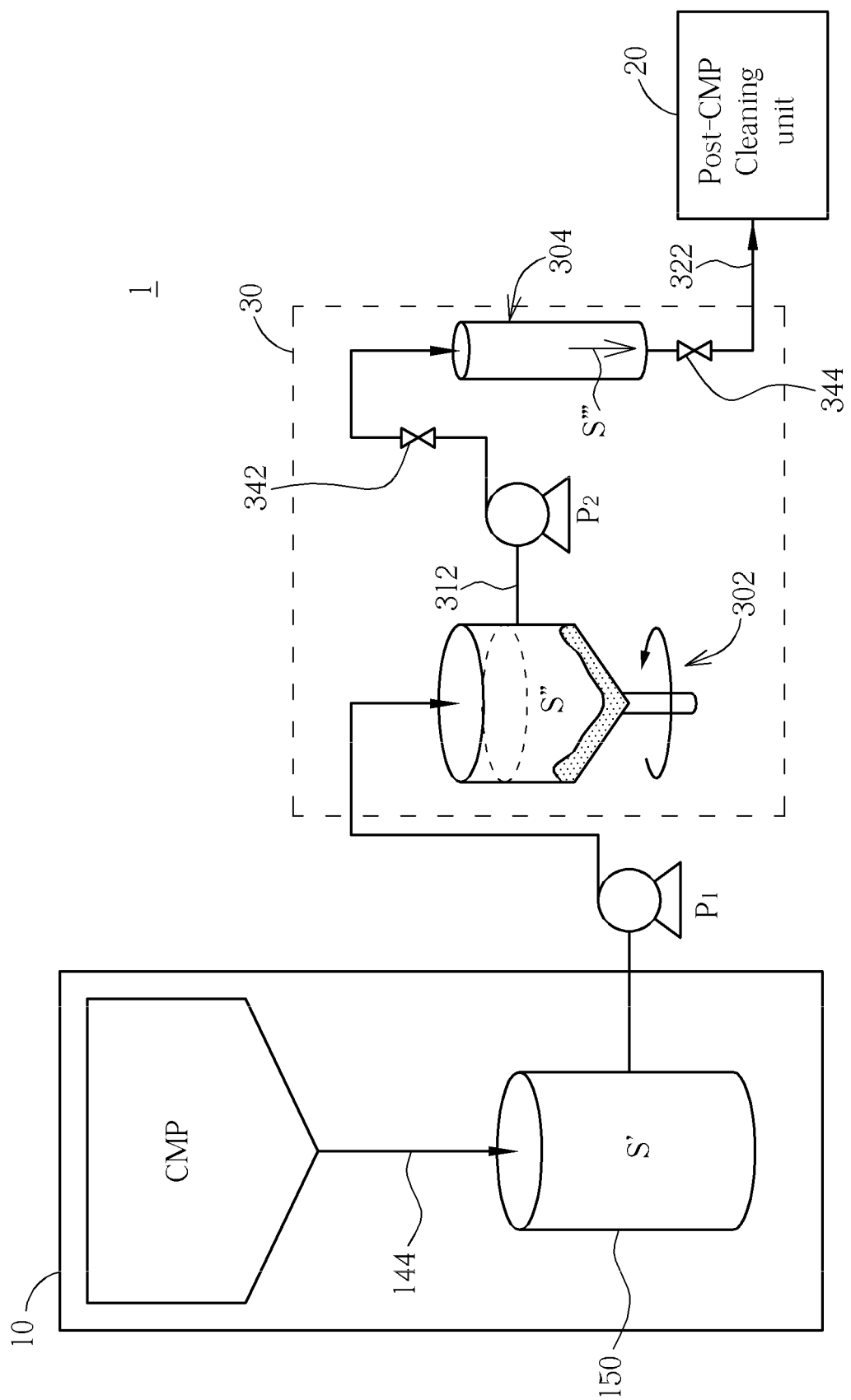
FIG. 1 is a schematic diagram showing germane parts of a CMP system in accordance with one embodiment of the present invention.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In the following description, numerous specific details are given to provide a thorough understanding of the invention. However, it will be apparent to one skilled in the art that the invention may be practiced without these specific details. In order to avoid obscuring the present invention, some well-known system configurations and process steps are not disclosed in detail. The drawings showing embodiments of the apparatus are semi-diagrammatic and not to scale and, particularly, some of the dimensions are for the clarity of presentation and are shown exaggerated in the figures. Also, where multiple embodiments are disclosed and described having some features in common, for clarity and ease of illustration and description thereof like or similar features one to another will ordinarily be described with like reference numerals.

Figure 2:
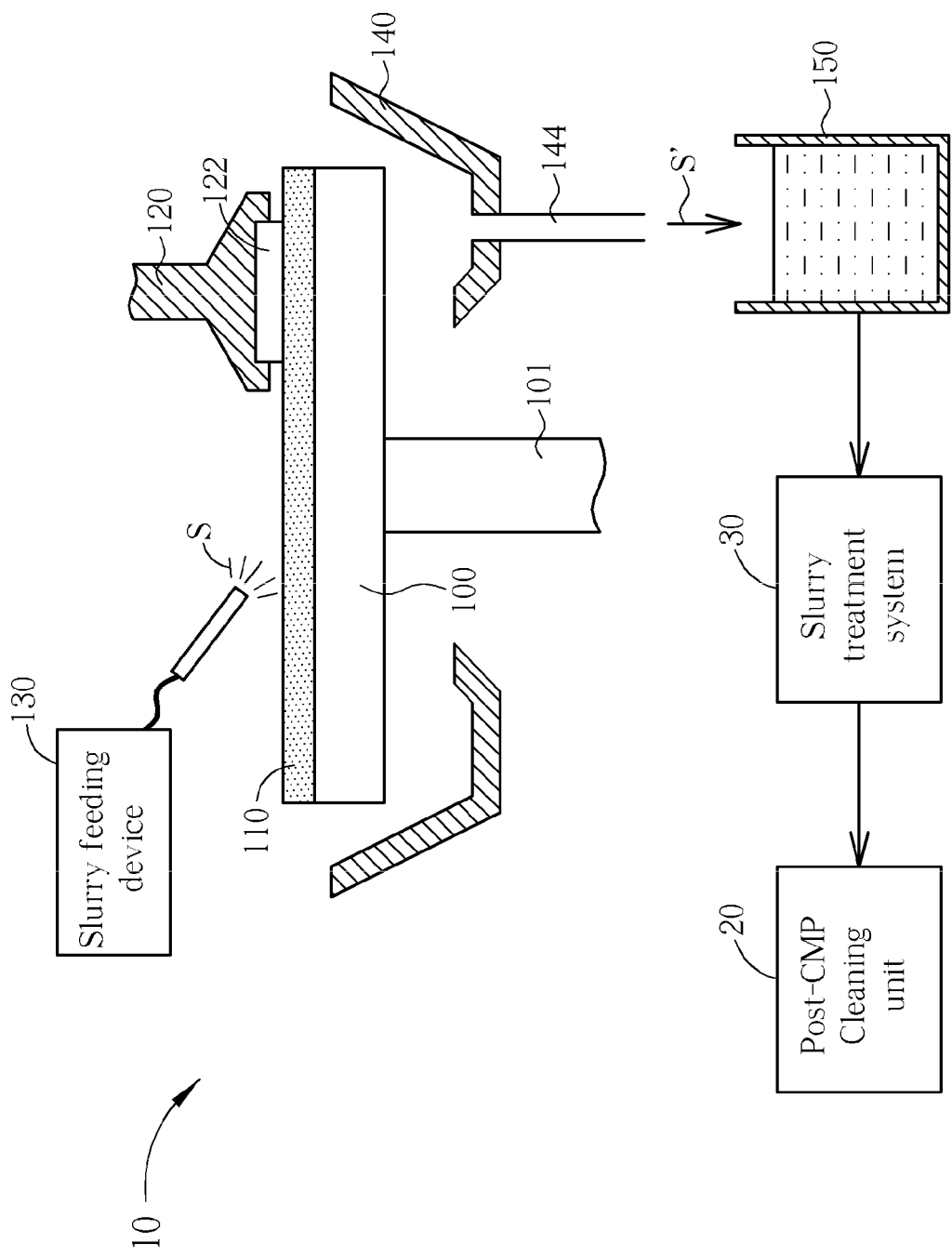
FIG. 2 schematically shows an exemplary CMP unit in accordance with one embodiment of the present invention.

FIG. 1 depicts a CMP system 1 in accordance with one embodiment of the present invention. As shown in FIG. 1, the CMP system 1 comprises at least a CMP wafer polishing unit or CMP unit 10 and a post-CMP cleaning unit 20, which may be configured together inside a cluster CMP tool, but not limited thereto. An exemplary CMP unit 10 is shown schematically in FIG. 2. In general, the CMP wafer polishing unit 10 may comprise a platen 100 connected to a shaft 101 for rotating the platen 100 about its central axis during CMP process. The shaft 101 may be driven by a motor (not shown). A polishing pad 110 is mounted on the platen 100. A wafer 122 is held and rotated by a carrier 120. In polishing, a slurry feeding device 130 may spray aqueous slurry S onto the polishing pad 110. The rotating wafer 122 is pressed against the wetted polishing pad 110 by the carrier 120 to cause relative movement between the polishing surface of the polishing pad 110 and the wafer 122.

The aqueous slurry, which is preferably basic, may include abrasive particles, a reactive chemical agent such as a transition metal chelated salt or an oxidizer, and adjuvants such as solvents, buffers, and passivating agents. Within the slurry, the salt or other agent provides the chemical etching action, with the abrasive particles, in cooperation with the polishing pad, providing the mechanical polishing action. According to the embodiment of the invention, the aqueous slurry may be of either an oxide, i.e., ceramic, or metal abrasive particle type. For example, the oxide-type particles may include silica ($SiO2$), ceria ($CeO2$), silicon carbide (SiC), silicon nitride ($Si3N4$), iron oxide ($Fe2O3$), alumina ($Al2O3$), and the like. The metal particles may include tungsten and copper. The slurry may be formulated to have a relatively high solids level which may be about 40% or more by weight, with a mean average abrasive particle size, which typically is given as a distribution range, of limits between about 0.05~5.0 μm for oxide slurries and about 20~35 μm for tungsten slurries.

Still referring to FIG. 1, the once-used slurry S' may be received by a waste liquid sink 140 and then stored in a waste liquid tank 150 through the waste slurry drain piping 144. The once-used slurry S' stored in the waste liquid tank 150 may be pumped to a slurry treatment system 30 by using a pump P1. In another case, the pump P1 may be omitted and the once-used slurry S' flows to the slurry treatment system 30 by gravity. According to the embodiment of the invention, the slurry treatment system 30 is used to separate the suspended particles such as abrasive particles or pad debris from the aqueous basic solution such as KOH or NH4OH of the once-used slurry S'.

According to the embodiment of the invention, by way of example, the slurry treatment system 30 may comprise a centrifugal separation device 302 and a filter 304. First, the once-used slurry S' is pumped into the centrifugal separation device 302 and most of the suspended particles in the once-used slurry S' can be separated by the centrifugal separation device 302 using centrifugal force, thereby forming clarified, aqueous slurry S" with very low content of suspended solid. The clarified slurry S" is then pumped into a filter 304 by a pump P2 via a conduit 312. The rest of the suspended particles can be completely removed by the filter 304 to form an extracted basic solution S'''. According to the embodiment of the invention, the filter 304 may be of surface-type filtration or tortuous path, depth-type filtration. For example, the filter 34 may contain membranes or fibrous media capable of filtering the smallest particle size in the once-used slurry S'. The extracted basic solution S''', which is an extracted and clarified aqueous basic solution containing substantially no solid content, is then distributed into the subsequent post-CMP cleaning unit 20 via a conduit 322 for cleaning the wafer surface. Optionally, a valve 342 and a valve 344 may be disposed in the conduit 312 and in the conduit 322 respectively for flow control or maintenance purposes. It is to be understood that other clarifier or filter components may be used in the slurry treatment system 30.

Figure 3:
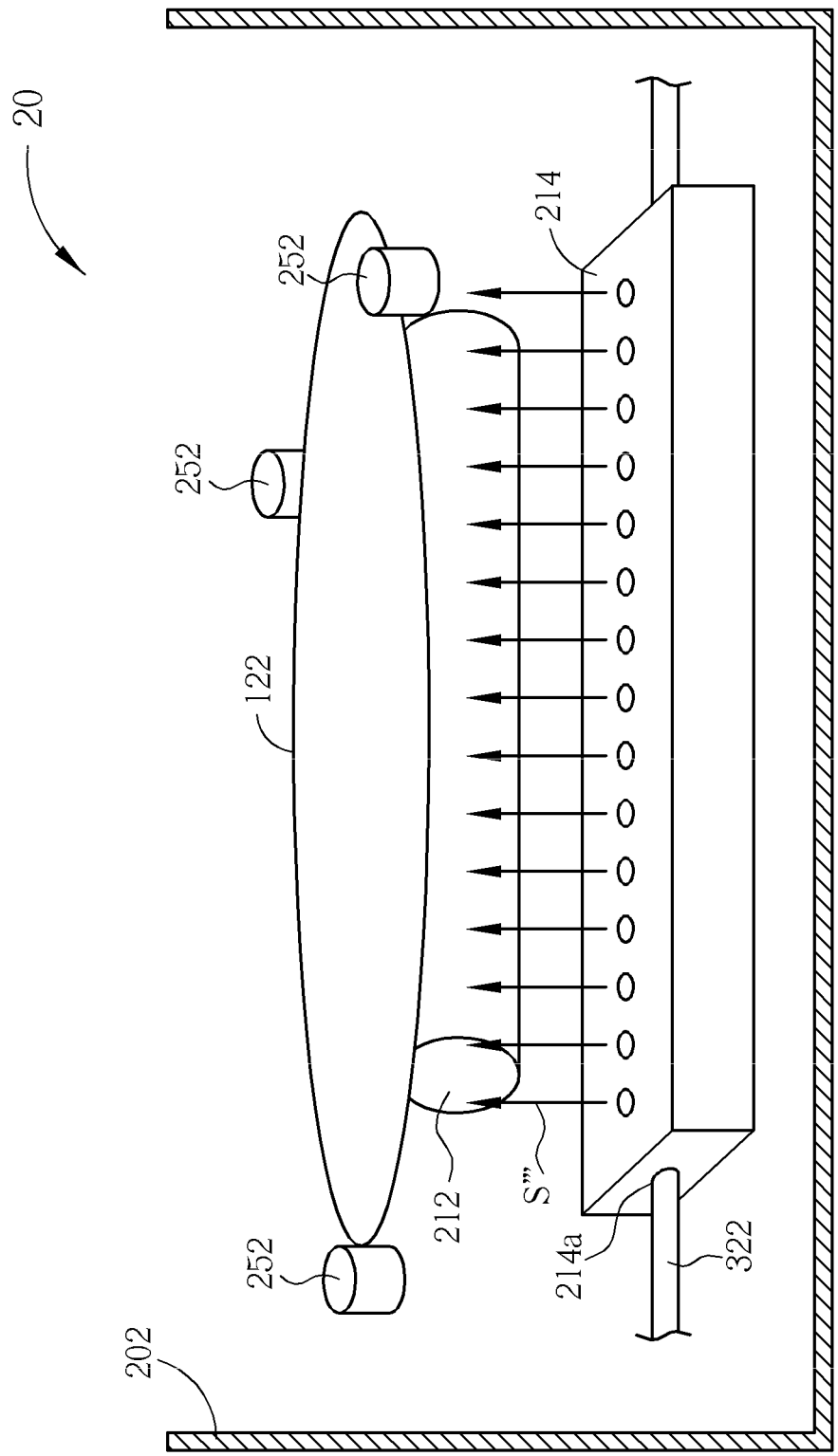
FIG. 3 schematically shows an exemplary post-CMP cleaning unit in accordance with one embodiment of the present invention.

An exemplary post-CMP cleaning unit 20 is shown schematically in FIG. 3. The post-CMP cleaning unit 20 may be a single-sided or double-sided scrubber cleaner for removing slurry residues from the polished wafer surfaces. As shown in FIG. 3, after polishing, the wafer 122 is transferred to the post-CMP cleaning unit 20 by robot. In the post-CMP cleaning unit 20, the wafer 122 may be held and rotated by a plurality of rollers 252 with its surface to be cleaned facing the roller-shaped brush 212, which are configured together within an enclosure 202. The wafer 122 is scrubbed by the brush 212 to remove the slurry residues from the wafer surface. During the scrubbing and cleaning process, the extracted basic solution S''' is simultaneously applied onto the surface of the wafer to be cleaned (the spouts indicated by arrows). Typically, the extracted basic solution S''' is sprayed by a spray bar 214 that is disposed in proximity to the brush 212. An inlet 214a of the spray bar 214 is connected to the conduit 322 that is connected to the outlet of the filter 304 in FIG. 2.

Those skilled in the art will readily observe that numerous modifications and alterations of the device and method may be made while retaining the teachings of the invention.

What is claimed is:

1. A chemical mechanical polishing (CMP) system, comprising:
    a wafer polishing unit producing a used slurry;
    a slurry treatment system for receiving and treating the used slurry to thereby produce an extracted basic solution, wherein the slurry treatment centrifugal separation device and a filter, and wherein the used slurry is first treated by the centrifugal separation device and then filtrated by the filter that removes the smallest particle size in the used slurry; and
    a post-CMP cleaning unit utilizing the extracted basic solution to wash a polished wafer surface.

2. The CMP system according to claim 1 wherein the extracted basic solution contains substantially no solid content.

3. The CMP system according to claim 1 wherein the post-CMP cleaning unit comprises a plurality of rollers for supporting and rotating a wafer, a brush for scrubbing the wafer, and a spray bar disposed in proximity to the brush for spraying the extracted basic solution onto the polished wafer surface.

4. The CMP system according to claim 3 wherein an inlet of the spray bar is connected to the slurry treatment system.

5. The CMP system according to claim 1 wherein the post-CMP cleaning unit is a scrubber cleaner.

6. The CMP system according to claim 1 wherein the wafer polishing unit comprises a platen, a polishing pad mounted on the platen, a carrier for holding and rotating a wafer, and a slurry feeding device.

7. The CMP system according to claim 1 wherein the extracted basic solution is KOH solution.

8. The CMP system according to claim 1 wherein the extracted basic solution is NH4OH solution.

* * * * *